(12) United States Patent
Grundy et al.

(10) Patent No.: US 7,652,381 B2
(45) Date of Patent: Jan. 26, 2010

(54) INTERCONNECT SYSTEM WITHOUT THROUGH-HOLES

(75) Inventors: Kevin P. Grundy, Fremont, CA (US); Joseph C. Fjelstad, Maple Valley, WA (US); Gary Yasumura, Santa Clara, CA (US); William F. Wiedemann, Campbell, CA (US); Para K. Segaram, Brookfield (AU)

(73) Assignee: Interconnect Portfolio LLC, Cupertino, CA (US)

( * ) Notice: Subject to any disclaimer, the term of this patent is extended or adjusted under 35 U.S.C. 154(b) by 0 days.

(21) Appl. No.: 11/055,578

(22) Filed: Feb. 9, 2005

(65) Prior Publication Data

US 2005/0189640 A1    Sep. 1, 2005

Related U.S. Application Data

(63) Continuation-in-part of application No. 10/990,280, filed on Nov. 15, 2004, now Pat. No. 7,280,372.

(60) Provisional application No. 60/543,130, filed on Feb. 9, 2004, provisional application No. 60/519,902, filed on Nov. 13, 2003.

(51) Int. Cl.
*H01L 23/48* (2006.01)
*H01L 23/52* (2006.01)
*H01L 29/40* (2006.01)

(52) U.S. Cl. ............... 257/777; 257/723; 257/E25.018

(58) Field of Classification Search ............ 257/723, 257/777, E25.018
See application file for complete search history.

(56) References Cited

U.S. PATENT DOCUMENTS

| | | | |
|---|---|---|---|
| 4,691,972 A | 9/1987 | Gordon | |
| 5,373,109 A | 12/1994 | Argyrakis et al. | |
| 5,475,264 A | 12/1995 | Sudo et al. | |
| 5,530,287 A | 6/1996 | Currie et al. | |
| 5,543,586 A | 8/1996 | Crane, Jr. et al. | |
| 5,623,160 A | 4/1997 | Liberkowski | |
| 5,701,233 A | 12/1997 | Carson et al. | |
| 5,821,457 A | 10/1998 | Mosley et al. | |
| 5,906,948 A | 5/1999 | Liu et al. | |
| 5,969,421 A | 10/1999 | Smooha | |
| 5,989,936 A * | 11/1999 | Smith et al. ............... | 438/106 |
| 6,001,671 A | 12/1999 | Fjelstad | |
| 6,020,559 A | 2/2000 | Maeda | |
| 6,054,652 A | 4/2000 | Moriizumi et al. | |
| 6,055,722 A | 5/2000 | Tighe et al. | |
| 6,284,984 B1 | 9/2001 | Ohyama | |
| 6,369,454 B1 | 4/2002 | Chung | |
| 6,421,254 B2 | 7/2002 | Crane, Jr. et al. | |
| 6,440,770 B1 | 8/2002 | Banerjee et al. | |
| 6,441,498 B1 | 8/2002 | Song | |
| 6,538,310 B2 | 3/2003 | Hoshino et al. | |
| 6,555,919 B1 | 4/2003 | Tsai et al. | |
| 6,635,957 B2 | 10/2003 | Kwan et al. | |

(Continued)

FOREIGN PATENT DOCUMENTS

JP    57-031166    * 7/1980

*Primary Examiner*—Howard Weiss
(74) *Attorney, Agent, or Firm*—Ronald R. Shea, Esq.

(57) ABSTRACT

Structures employed by a plurality of packages, printed circuit boards, connectors and interposers to create signal paths which reduce the deleterious signal quality issues associated with the use of through-holes. Disclosed structures can coexist with through-hole implementations.

28 Claims, 13 Drawing Sheets

U.S. PATENT DOCUMENTS

| | | |
|---|---|---|
| 6,680,530 B1 | 1/2004 | Pillai et al. |
| 6,777,795 B2 | 8/2004 | Sasakura et al. |
| 6,900,390 B2 | 5/2005 | Halter |
| 6,900,528 B2 | 5/2005 | Mess et al. |
| 6,982,488 B2 * | 1/2006 | Shin et al. .................. 257/777 |
| 2002/0070446 A1 | 6/2002 | Horiuchi et al. |
| 2002/0171130 A1 * | 11/2002 | Takahashi et al. ........... 257/673 |
| 2003/0218191 A1 | 11/2003 | Nordal et al. |

* cited by examiner

Standard Packages (modified) on Stairstep PCB

INTERCONNECT SYSTEM WITHOUT THROUGH-HOLES

CROSS REFERENCE TO RELATED APPLICATIONS

This application is a continuation-in-part and hereby incorporates by reference, U.S. patent application Ser. No. 10/990,280 filed on Nov. 15, 2004, now U.S. Pat. No. 7,280,372, issued on Oct. 9, 2007, which claims benefit of U.S. Provisional Application No. 60/519,902 filed Nov. 13, 2003. This application also claims benefit of and incorporates by reference U.S. Provisional Application No. 60/543,130, filed Feb. 9, 2004.

TECHNICAL FIELD

The present invention relates to generally to the field of printed circuit board (PCB), package, connector and interposer design, and more particularly to the methods by which these components form signal connections between each other.

BACKGROUND

Today's technique of building electronic signal paths relies heavily upon interconnect structures invented over forty years ago. FIG. 1, for example, illustrates a prior art chassis system wherein through-holes are used to route signals from integrated circuits through packages, printed circuit boards (PCBs) and backplanes. Packages, PCBs and connectors can utilize these through-hole signal passage ways 7 for both signal conduction and in the case of connectors, for mechanical support. Inroads have been made towards the elimination of through-holes in certain types of component interfaces. Surface mount IC packages, for example, allow signals to connect between the bottom surface of an IC package and the top surface of a PCB without the use of through-holes by employing solder balls. However, through holes are still needed for packages and PCBs to transfer signals from their exterior surfaces to internal signal routing layers.

Through-holes, for low frequency signals, may not significantly impact the quality of a signal traveling through them. As the frequency increases, signal quality does become affected and consequently designers must account for the deleterious effect of the through-hole on signal quality. In a typical chassis implementation, FIG. 1, a signal might have to travel through 12 through-holes 7 (inclusive of through-holes in the IC package) to reach its destination. In an optimized implementation for higher speed, the number of holes might be reduced by a factor of two. Even so, a signal path with six disruptive impedance variances (the through-holes) will impact the signal quality of a high speed signal. Manufacturers have devised ways to mitigate or reduce the effects of impedance disturbance of these through-holes. Blind vias and back drilling are among the most effective techniques in use. However, both blind vias and back drilling are time consuming and relatively expensive.

BRIEF DESCRIPTION OF DRAWINGS

Drawings for the invention are divided into four general categories: planar printed circuit boards with apertures coupled with packages (FIGS. 4 through 12); printed circuit boards coupled with planar packages (FIGS. 13 through 16); planar printed circuit boards coupled with packages (FIGS. 17 through 24) and printed circuit boards coupled with packages (FIGS. 25 through 31).

DETAILED DESCRIPTION

Figure 1:
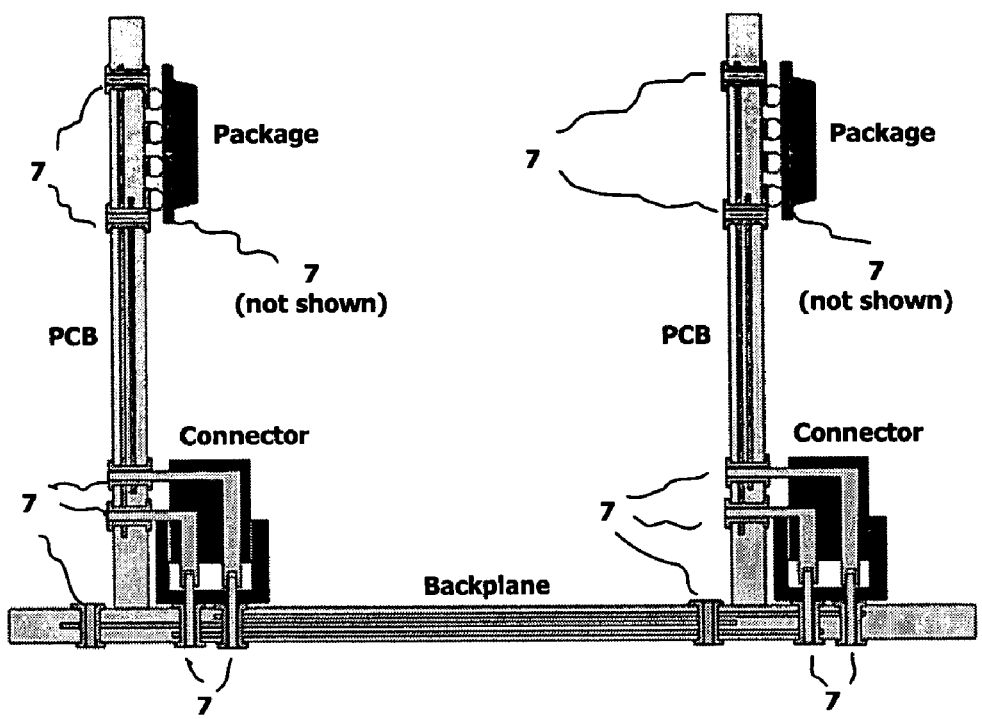
FIG. 1 illustrates prior art chassis connection system utilizing through-hole technology for the transmission of signals through multiple board connections.
Figure 2A:
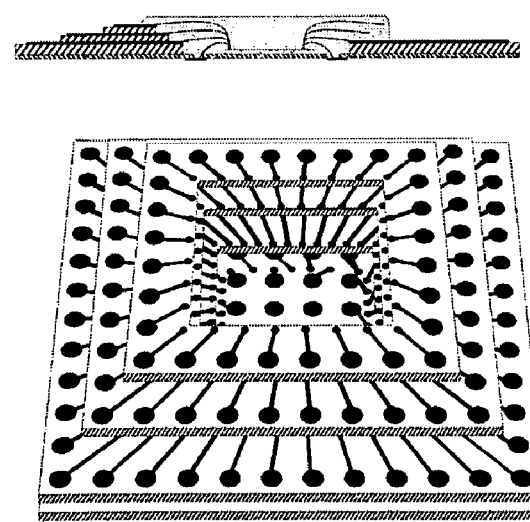
FIG. 2A illustrates prior art of a stair-step IC package.

In the following description reference is made to stair-step packages. Integrated circuit packages having stair-step structures described herein refer to, for example, any of the stair-step package structures disclosed in U.S. patent application Ser. No. 10/947,686 ("Multi-Surface IC Packaging Structures and Methods for Their Manufacture"), filed Sep. 23, 2004, which is incorporated herein by reference. An example of a stair-step package is illustrated in FIG. 2A.

Figure 2B:
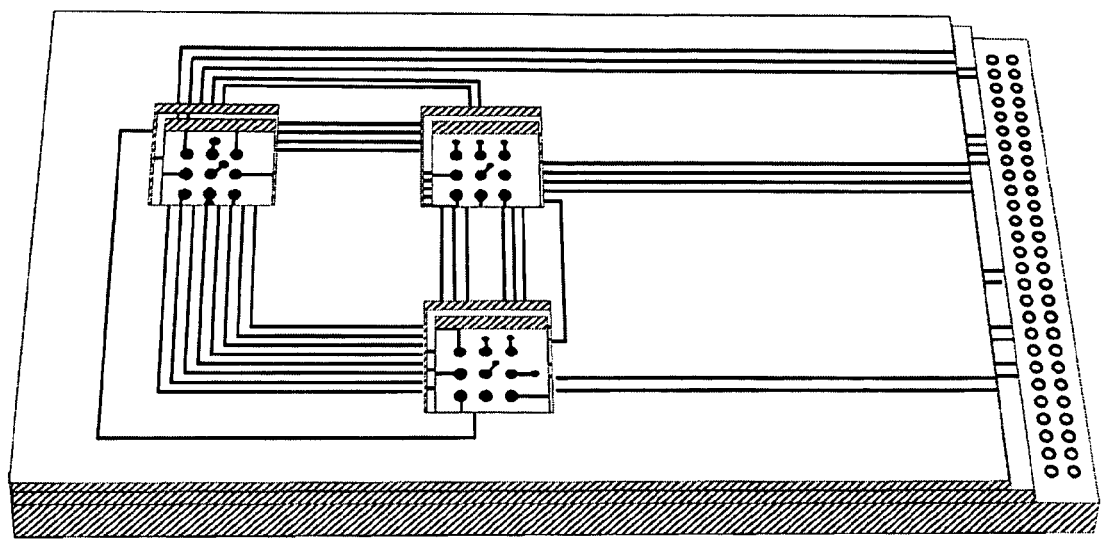
FIG. 2B illustrates prior art of a printed circuit board built with a stair-step apertures for stair-step packages and stair-step card edge for stair-step connectors.

In the following description reference is made to stair-step printed circuit boards. Stair-step printed circuit boards described herein refer to, for example, any of the stair step printed circuit board structures disclosed in U.S. patent application Ser. No. 10/990,280 ("Stair Step Printed Circuit Board Structures for High Speed Signal Transmissions"), filed Nov. 15, 2004, which is incorporated herein by reference. An example of a stair-step printed circuit board is illustrated in FIG. 2B.

Figure 2C:
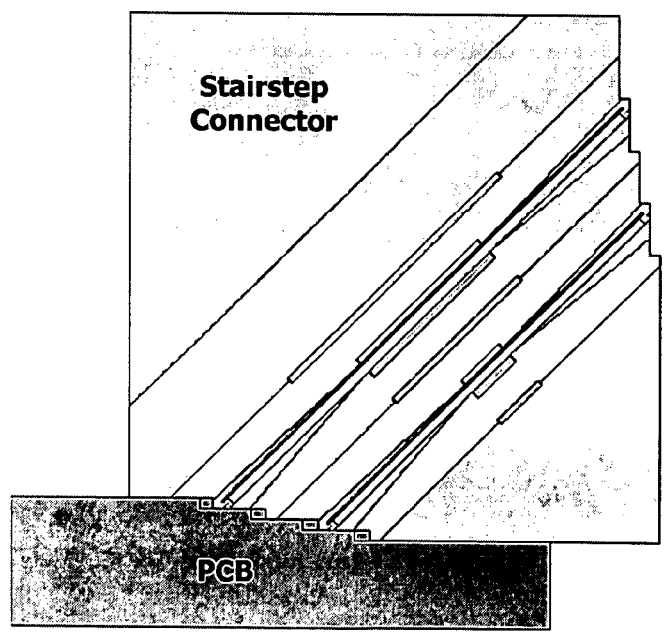
FIG. 2C illustrates prior art of a stair-step connector.

In the following description reference is made to stair-step connectors. Connectors and interposers having stair-step structures described herein refer to, for example, any of the stair-step structures disclosed in U.S. Provisional Patent Application No. 60/543,141 ("High Speed, Direct Path, Stairstep, Electronic Connectors with Improved Signal Integrity Characteristics and Methods for Their Manufacture"), filed Feb. 9, 2004, which is incorporated herein by reference. An example of a stair-step printed circuit board is illustrated in FIG. 2C.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa.

In the following description and in the accompanying drawings, structures shown or described as being stair-step printed circuit boards may also be other electrical components having a stair-step electrical connection structure. Printed circuit boards may also include, without limitation, line cards, daughter boards, daughter cards, mother boards, backplanes and so forth.

Typically a package refers to an embodiment of an integrated circuit contained within (or) on a substrate or encasement with multiple electrical or optical connection points. Other examples of technology which may be contained within a stair-step package include: optical processors, lasers, light emitting diodes, passive electrical devices (resistors, capacitors, inductors), electromagnetic devices (relays), energy storage technologies (batteries, fuel cells), memory storage elements of any technology, displays, transducers, mechanical actuators or simple electrical connection paths. Other technologies not mentioned specifically are allowed in other embodiments of a package. Although a single or double stair-step structure may be illustrated or presented, stair-stepping may be utilized to any number of levels as required. In addition, stair-steps, while presented as even or equally spaced may be implemented with different heights and/or widths between steps. While connection points illustrated on stair-step structures within the invention are shown in the horizontal direction, they may also be constructed in the vertical direction, or in both horizontal and vertical directions. References are made to stair-step printed circuit boards and connectors. While the invention describes methods for the use of printed circuit boards and enables the fabrication of printed circuit boards using materials not generally suitable in applications that require through-holes, it does not preclude the use of conventional printed circuit board materials and/or combinations of conventional printed circuit board materials with non-conventional materials. Furthermore, the stair-step printed circuit boards shown in the invention are not limited to the number of layers described or illustrated in the drawings in this disclosure and may be of any count.

Through-hole connections may be used in any combination with the invention. Indeed, this is an important benefit of the invention. References are made to signal paths and connections. Signal paths can be made from wires, metal lead frames, flex material, fiber optics or any material suitable for achieving a desired electromagnetic transmission goal. Signal paths, although shown in the invention as a single point-to-point path in the plane of the disclosure drawing, may alternatively represent multiple signals, such as a bus or set of disparate signals (such signals would be occluded from view since the drawings are 2-dimensional). Connections can be made from solder, conductive adhesives, anisotropic films, capacitors, conductive films, springs, welding or any material or technique suitable for achieving a desired design goal. The number of connections is not limited to those illustrated in the invention.

Figure 3A:
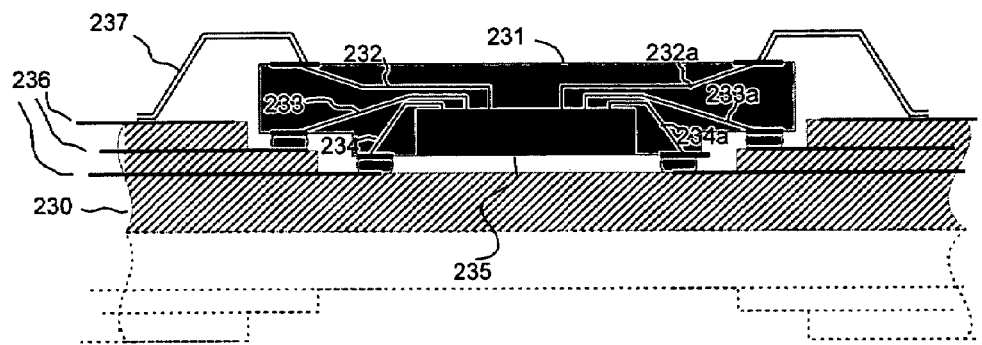
FIGS. 3A and 3B illustrates typical usage of shading and/or graphic representations used in drawings in the invention.
Figure 3B:
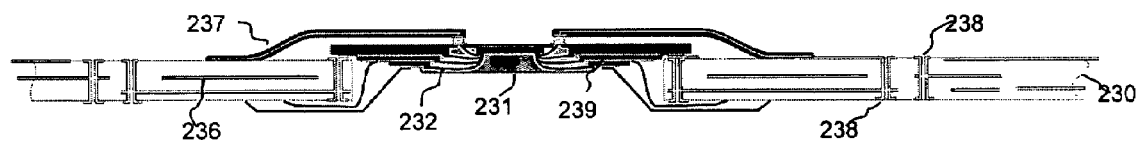

The present invention is illustrated by way of example, and not by way of limitation, in the figures of the accompanying drawings and in which like reference numerals refer to similar elements and in which:

FIGS. 3A and 3B illustrate typical drawing styles for most of the illustrations used in describing the invention. In FIG. 3A, a cross-hatched outline typically represents a printed circuit board 230. Solid, thicker black lines typically represent conductive material 236 as part of the multiple surfaces (both internal and external) of the printed circuit board 230. Outlined lines 237 typically represent signal paths connecting packages 231 to other packages 231 or printed circuit boards 230, or to any other point normally reserved for connection on a device. These signal paths may be constructed from, but are not limited to wires, coaxial wires, metal lead frames, optical fibers, flexible circuits and need not be identical. Solid, thinner lines 232, 233, 234, 232a, 233b, 234b illustrated within the area of shading of a package 231 typically represent the signal paths between the outside of a package 231 and a device 235 within or on a package 231. These signal paths 232, 233, 234, 232a, 233b, 234b may be constructed from, but are not limited to wires, coaxial wires, flexible circuits, springs, optical fibers or metal lead-frames. Signal paths 232, 233, 234, 232a, 233b, 234b are not required to be constructed with the same method: they may all be the same or different. For example, die bond wires and flexible circuits may be mixed in a package. The termination of signal path illustrated by 233, 233a is to be construed as terminating at the first stair-step while the termination of signal path 234, 234a is to be construed as terminating at the second stair-step and so forth. The termination of signal path 232, 232a is to be construed as terminating at the opposite surface of the stair-step surfaces. Devices 235 are typically illustrated in the invention drawings as solid rectangles. Devices may also be comprised of multi-devices FIG. 3B is a style of drawing referred to as refined and is used to add clarity. The style of these refined drawings dispenses with cross hatching of the PCB (230) and shows more realistic renderings of PCB construction (inclusive of through-holes and traces). Planar signal paths 239 within packages illustrated in the refined style appear white or gray.

In interconnections according to embodiments of the invention, packages with at least one signal layer are connected to other packages or structures with at least one signal layer through tiered layers of exposed signal planes. By this structure, signals can enter or exit a package through the exposed layers of the package substrate and be connected to a similarly exposed set of signals on another package or structure thereby allowing a connection between two devices without the use of through-holes.

Figure 4:
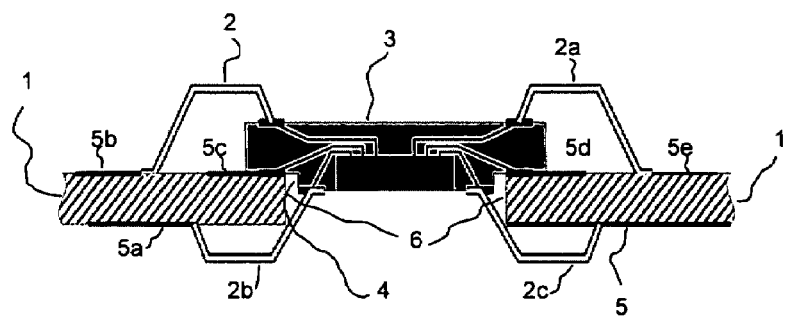
FIG. 4 illustrates a package with multiple connection planes mounted into a printed circuit board with a cutout section.

FIG. 4 illustrates an embodiment of the invention: a planar printed circuit board 1 which has an opening 6 cut entirely through the substrate 1 with a stair-step package 3 mount allowing for the conveyance of signal paths 2b, 2c to the opposite side 5, 5a of the planar printed circuit board 1 without the use of through-holes. The signal paths 2, 2a, 2b, 2c may be constructed through various means. For example, a common embodiment might be the use of flex material. Other embodiments might include single conductor wires, coaxial wires, metal lead frames or metalized plastic conductors. Electrical attachment of the package 3 to the planar printed circuit board 1 with a cutout 6 may be achieved through various means.

Still referring to FIG. 4, the opening in the printed circuit board 1 can be of any arbitrary size or dimension. The thickness of the printed circuit board 1 can be of any depth. The material of the printed circuit board 1 can be made solidly made of a single material or a composition of layers of different materials with internal signals, power and ground layers.

Still referring to FIG. 4, although only a single stair-step 4 in the package 3 is illustrated, multiple stair-steps in package 3 are allowed with the opening in the printed circuit board 1 to be sized to allow any level of stair-step to be mated. The depth of any particular stair-step on a package 3 may be independent or the same any other stair-step on the package 3.

Figure 5:
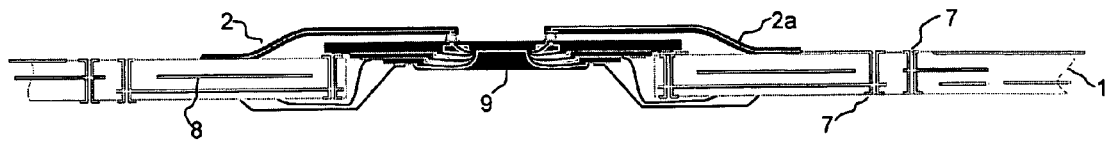
FIG. 5 illustrates an embodiment of the structure illustrated in FIG. 4 incorporating stair-step packages with more than one stair step.

FIG. 5 illustrates a different embodiment of a stair-step package coupled with a printed circuit board with an opening and shows how prior art construction utilizing through-holes 7 can coexist with the invention. The package 9 has three stair-step levels.

Figure 6:
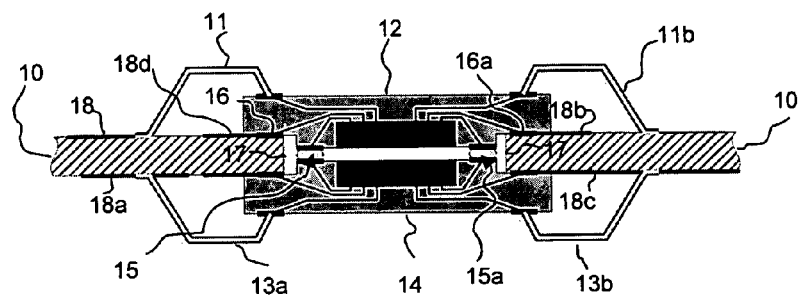
FIG. 6 illustrates two packages which are mounted in opposition to each other through an opening of a printed circuit board and containing multiple signal paths between the packages and the printed circuit board.

FIG. 6 illustrates an embodiment of the invention which includes two stair-step packages 12, 14, each with a single stair step, coupled together through an opening 17 in a printed circuit board 10. Each package 12, 14 is oriented such that their stair-steps face each other. The packages 12, 14 connect through connection points 15, 15a. Each package 12, 14 connects to the printed circuit board 10 through contact points 16, 16a of the packages and to traces on the surface 18, 18b of the printed circuit board 10. Further connections are made from the packages 12, 14 to the printed circuit board 10 through signal paths 11, 1b, 13a and 13b.

Figure 7:
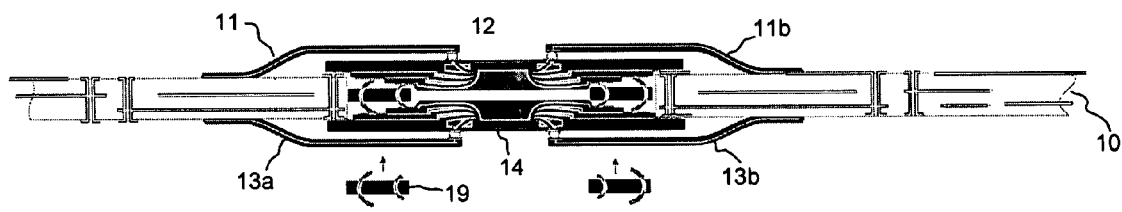
FIG. 7 illustrates an embodiment of the structures of FIG. 6 incorporating stair-step packages with more than one stair step.

FIG. 7 illustrates an embodiment of the invention which includes two stair-step packages 12, 14 coupled with a printed circuit board 10 with an opening. Both stair stepped packages have three stair steps. The embodiment also includes the addition of an interposing interconnection device 19 to effect the connection of the two stair stepped packages 12, 14 (instead of a direct connect between the packages) and shows how a conventional through-hole construction can be used in combination with the novel package structure.

Figure 8:
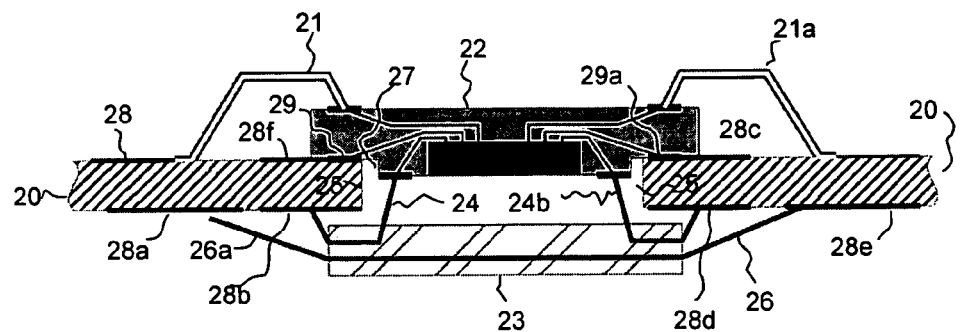
FIG. 8 illustrates a single stair-step package mounted into a printed circuit board with multiple signal connection paths and a signal transmission package mounted underneath the package.

FIG. 8 illustrates an embodiment of the invention which includes a printed circuit board 20 with an opening 25 coupled with stair-step package 22. The package has a single stair step. Additionally a connector 23 is placed opposite the opening 25 in the printed circuit board 20 which allows for signal path conduction across the opening 25 and allows for connection to the package 22. The package 22 is connected to the printed circuit board 20 through contacts 29, 29a of the package 22. Further connections are made from the package 22 to the printed circuit board 20 through signal paths 21 and 21a. The package 22 is also connected to a connector 23 with signal conduction paths to the printed circuit board 24, 24b. The connector 23 also provides a signal path from one side of the printed circuit board opening 25 (26) to the other side of the opening 26a. The design methodology of the connector 23 may be constructed with any materials suitable to meet design goals.

Figure 9:
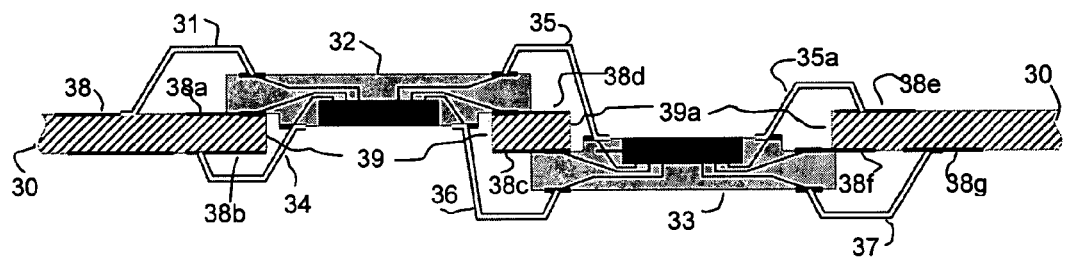
FIG. 9 illustrates two stair-step packages mounted in two openings of a printed circuit board with each stair-step package mounted on opposite sides.

FIG. 9 illustrates an embodiment of the invention which includes a printed circuit board 30 with two openings 39, 39a. In one opening 39, a stair-step package 32, with a single stair step, is mounted on top of the printed circuit board 30 with its stair step facing towards the opening 39. In the other opening 39a, a second stair-step package 33, with a single stair step, is mounted on the bottom of the printed circuit board with its stair step facing towards the opening 39a. The openings 39, 39a are arranged to allow for the connection between package 32 and 33. Each package 31, 33 is connected to the printed circuit board signal paths 38a, 38d, 38c, 38f. Additionally, the packages 32, 33 are connected to the printed circuit board 30 through signal paths 31, 34, 35a and 37. The packages 32, 33 are connected to each other through signal paths 35, 36. Although only two packages are shown, the invention allows for unlimited cascading of packages. Furthermore, the invention allows for the packages to be of different shape, size, number and distance of stair steps.

Figure 10:
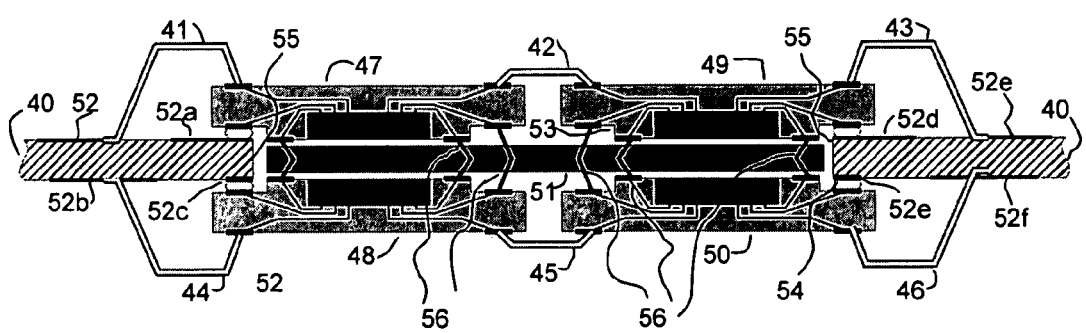
FIG. 10 illustrates four stair-step packages mounted in a single opening of a printed circuit board wherein two of the stair-step packages are mounted in opposition to the other two stair-step packages and connected together through an intermediary package.

FIG. 10 illustrates an embodiment of the invention which includes four stair-step packages 47, 48, 49, 50, each with a single stair step, mounted in an opening 55 within a printed circuit board 40. Two packages 47, 48 are mounted over the top of the printed circuit board opening 55 with their stair-steps facing towards the opening 55. Two packages 49, 50 are mounted over the bottom of the printed circuit board opening 55 with their stair-steps facing towards printed circuit board opening 55. Sandwiched in between the four packages 47, 48, 49, 50 is an interposer 51 which provides for signal paths to connect the top packages 47, 48 to the bottom packages 49, 50. Although illustrated as vertical signal paths through the interposer 56, the interposer may be constructed in any configuration to allow horizontal and vertical connection schemes in order to achieve the desired connectivity. The interposer 51 is not limited to any particular construction technology and can be designed from the appropriate materials to achieve the desired design goals. Each package 47, 48, 49, 50 is connected to the printed circuit board 40 through signal paths 41, 44, 43, 46. Additionally each package 47, 48, 49, 50 is connected to the printed circuit board 40 through connections 52a, 52c, 52d, 52e.

Figure 11:
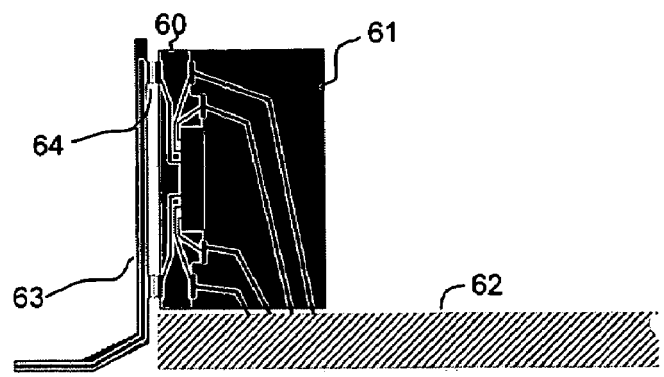
FIG. 11 illustrates a stair-step package mounted into a connector substrate wherein the package serves as a method for connection.

FIG. 11 illustrates an embodiment of the invention which includes a printed circuit board 62, a stair-step package connector 61 and a stair-step package 60, with a single stair step, arranged as a connector for the entire assembly (60,61,62). The package 60 may connect to a multitude of different devices such as cables, other packages, connectors or interposers.

Figure 12:
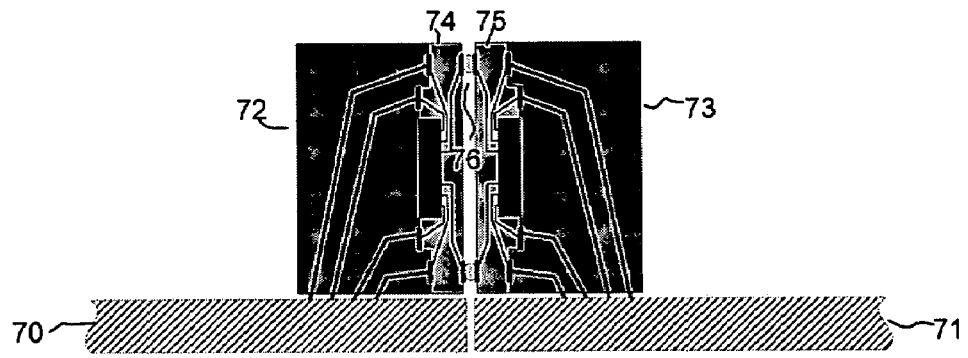
FIG. 12 illustrates stair-step packages mounted into connector substrates and providing for a method of connection.

FIG. 12 illustrates an embodiment of the invention which includes two printed circuit boards 70, 71 each having the topology shown in FIG. 11 but arranged such that the stair-step packages 74, 76 become the connecting point between each of the assemblies.

Figure 13:
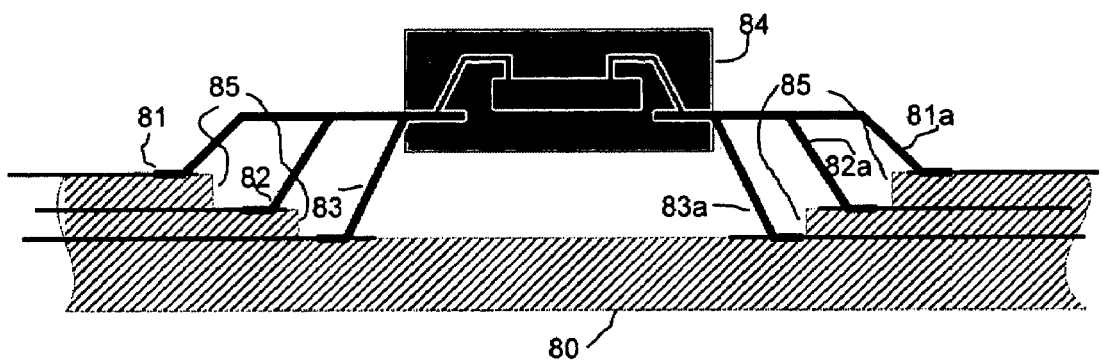
FIG. 13 illustrates a co-planar package connected into a stair-step printed circuit board.

FIG. 13 illustrates an embodiment of the invention which includes a planar package 84 coupled with a printed circuit board 80, having two stair steps, wherein the body of the planar package is not touching the substrate 80. The planar package 84 is connected to the printed circuit board through signal paths 81, 82, 83, 81a, 82a, 83a. The signal paths 81 and 81a connect the planar package 84 to the top of printed circuit board 80. Signal paths 82, 82a connect the planar package 84 to the first exposed layer of the printed circuit board. Signal paths 83, 83a connect the planar package to the second exposed layer of the printed circuit board. The signal paths 81, 81a, 82, 82a, 83, 83a, in a typical embodiment common to Dual In-Line (DIP), Small or Swill Outline (SO), Quad Flat Pack (QFP) and Tape Automated Bonding (TAB) To adapt such devices, IC package leads are formed as the egress from the planar package. Other signal path conduction techniques may be used in alternative embodiments.

Figure 14:
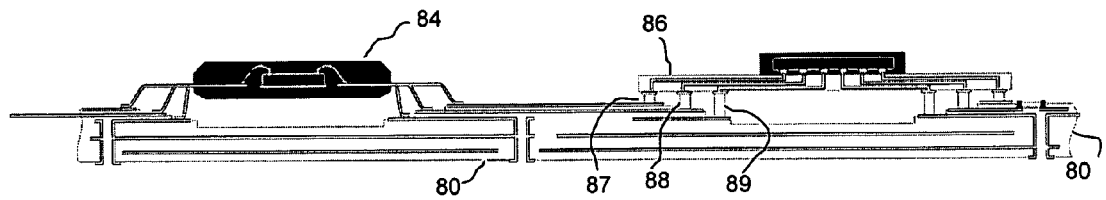
FIG. 14 illustrates an alternate embodiment of FIG. 13 showing two coplanar packages mounted into a stair-step printed circuit board.

FIG. 14 is a more refined illustration of the embodiment shown in FIG. 13 and illustrates how the invention can coexist with prior art through-hole signal paths. It also shows how a planar package 86 can utilize varying height interconnects 87 88 89 to effect connection to the stair stepped substrate 80.

Figure 15:
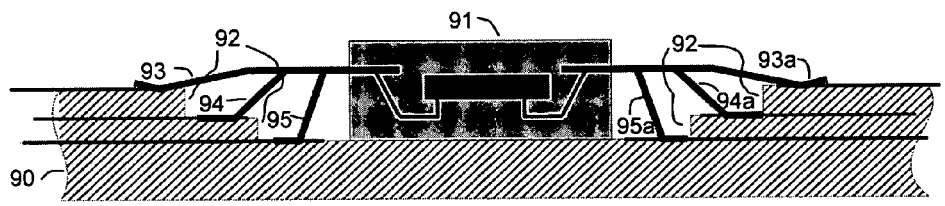
FIG. 15 illustrates a co-planar package connected into a stair-step printed circuit board.

FIG. 15 illustrates an embodiment of the invention which includes a planar package 91 coupled with a printed circuit board 90 wherein the body of the planar package is mounted against the substrate 90.

Figure 16:
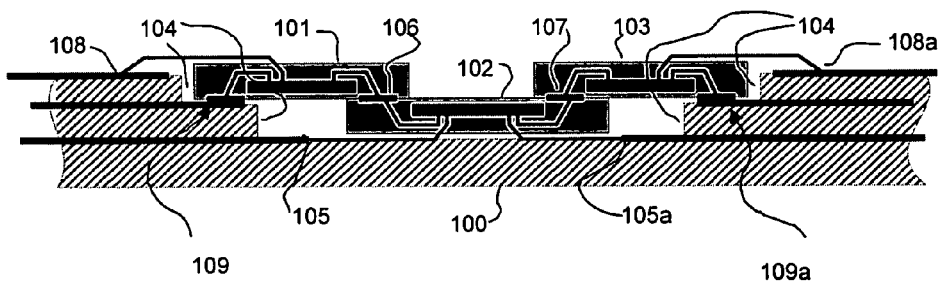
FIG. 16 illustrates three co-planar packages coupled together physically and the combined coupled unit mounted into a stair-step printed circuit board.

FIG. 16 illustrates an embodiment of the invention which includes three planar packages 101, 102, 103 wherein each planar package has connection points integral to the package body. The packages 101, 102, 103 are arranged in alternating orientation such that one side of planar package 101 rests on the first exposed layer 104 of the stair-step printed circuit board and the other end of planar package 101 rests upon planar package 102 such that connection is made between the two packages. Planar package 103, in a similar arrangement, rests upon the opposite side of planar package 102. Planar packages 101, 102 connect to the top layer of the stair-step printed circuit board through 108, 108a. Furthermore, planar packages 101, 102 connect to the first exposed layer of the printed circuit board through 109, 109a. Planar package 102 connects to the second exposed layer of the printed circuit board through signal paths 105, 105a. Although only three planar packages are illustrated, any arbitrary number of packages may be concatenated, placed and connected within a stair-step well.

Figure 17:
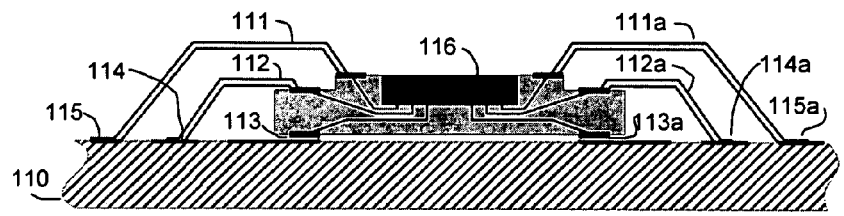
FIG. 17 illustrates a stair-step package mounted onto a planar printed circuit board wherein the step structure of the stair step package are facing away from the printed circuit board.

FIG. 17 illustrates an embodiment of the invention which includes a stair-step package 116, with a single stair step, mounted onto a planar printed circuit board 110 which does not contain openings and where the stair-step in the package faces away from the printed circuit board 110. Signal paths 111, 112, 111a, 112a connect the package 116 to printed circuit board 110. Signal paths 113, 113a connect the package 116 to traces disposed on the surface of substrate 110.

Figure 18:
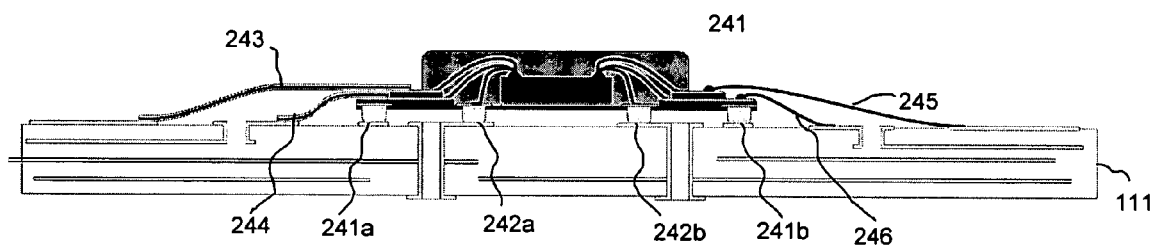
FIG. 18 illustrates a refined embodiment of FIG. 17 and also shows a different orientation of connections internal to the package.

FIG. 18 illustrates an embodiment of the invention in which a stair-step package 241, with a single stair step, similar to package 116 of FIG. 17 is used in combination with a conventional through-hole printed circuit board.

Figure 19:
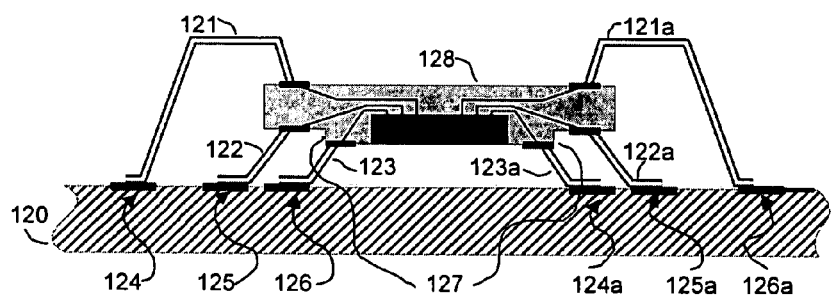
FIG. 19 illustrates a stair-step package mounted onto a planar printed circuit board wherein the stair-steps of the package are facing towards the surface of the printed circuit board.

FIG. 19 illustrates an embodiment of the invention which includes a stair-step package 128, with a single stair step, mounted onto a planar printed circuit board 120 which does not contain openings and where the stair-step in the package faces towards the printed circuit board 120. Signal paths 121, 122, 123, 121a, 122a, 123a connect the package 128 to printed circuit board 120. These connections can be wire, coax, flex circuit or any other material which provides a signal conduction path between the package 128 and the printed circuit board (120).

Figure 20:
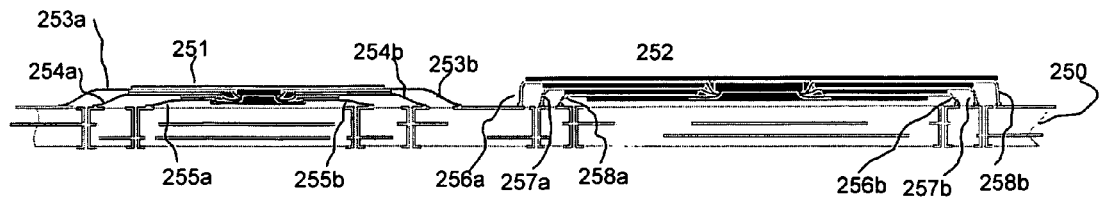
FIG. 20 illustrates a refined embodiment of FIG. 19 and additionally shows two packages of varying size and connection method.

FIG. 20 illustrates an embodiment of the invention in which two different kinds of packages 251, 252, each similar to the package 128 of FIG. 19 but having more stair steps, is coupled to a conventional planar printed circuit board 250.

Figure 21:
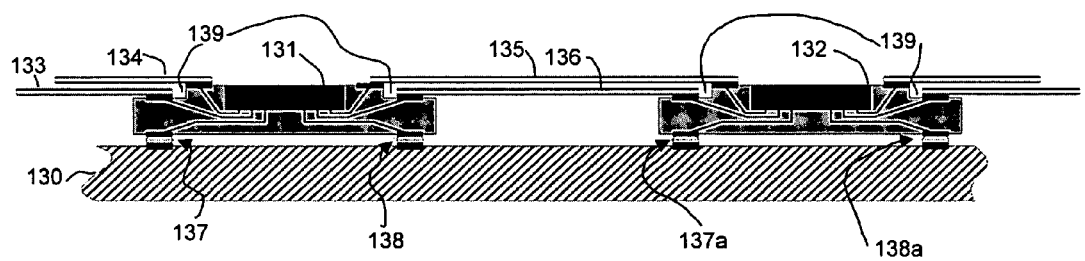
FIG. 21 illustrates two stair-step packages mounted on a planar printed circuit board with their stair-steps facing away from the printed circuit board and the packages connected together through means other than the printed circuit board.

FIG. 21 illustrates an embodiment of the invention which includes two stair step packages 131, 132, each with a single stair step, mounted onto a planar printed circuit board 130 such that both packages are arranged with their stair-steps facing away from the surface of the planar printed circuit board 130. Connections are made between the packages through signal paths 137, 138, 137a, 138a. Between packages 131, 132 two signal paths exist 135, 136. Signal path 135 connects the topmost surface of packaged 131 and the topmost surface of package 132. Likewise, signal path 136 connect the two packages together at their second stair-step level. Signal paths 133, 134 are shown to emphasize that the connection paths may continue to either side of the presented structure. Additionally, there is no requirement in this configuration for a signal path connection to start or terminate at same levels of stair steps between packages. A signal path may start at any stair-step level on one package and terminate at the same or any other stair-step level on a different package.

Figure 22:
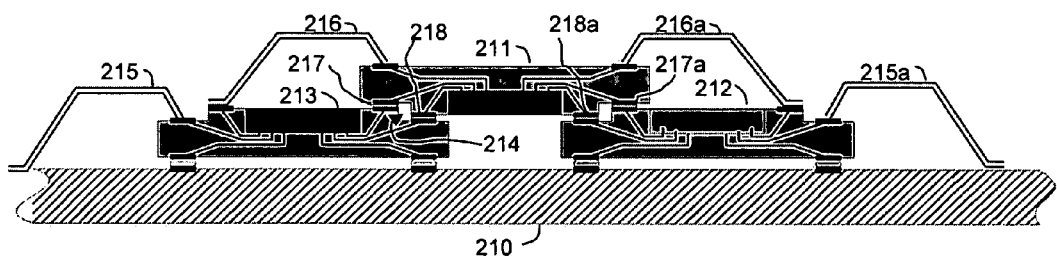
FIG. 22 illustrates three stair-step packages mounted together and mounted onto a planar printed circuit board.

FIG. 22 illustrates an embodiment of the invention which, while similar to the structure in FIG. 21, utilizes a third stair-step package 211 to bridge across two stair-step packages 213, 212 mounted onto a planar printed circuit board 210. Direct signal path connections 217, 217a, 218, 218a are made between the three packages 213, 211, 212 due to package 211 being "flipped" and directly resting upon the other two packages 212 and 213 and matching the stair step profiles of packages 212, 213. Additional signal paths are possible as demonstrated by signal paths 215, 216, 216a, 215a.

Figure 23:
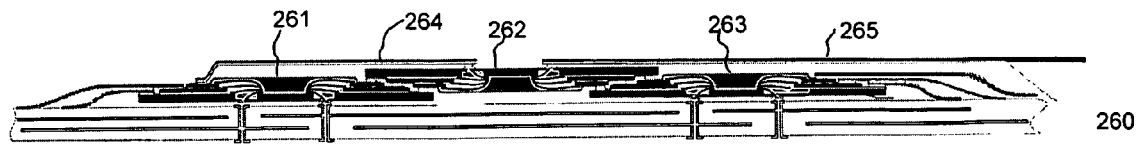
FIG. 23 illustrates a more refined embodiment of FIG. 22 and shows different interconnect within the package.

FIG. 23 illustrates an embodiment similar to that of FIG. 22, but where the packages 261, 263 have two levels of stair step and are used in combination with a planar printed circuit board.

Figure 24:
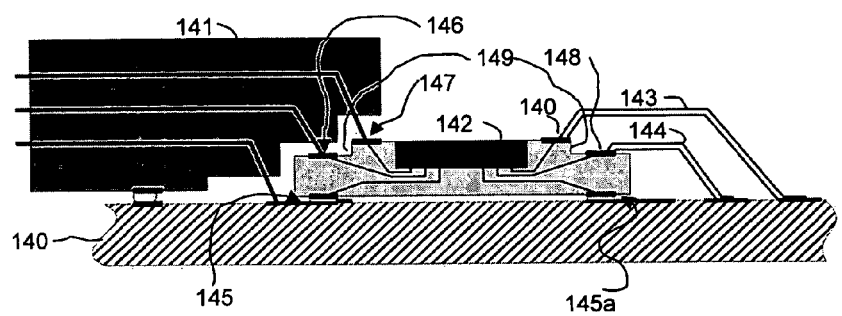
FIG. 24 illustrates a stair-step package mounted onto a planar printed circuit board with a stair-step connector mounted onto one side of the package.

FIG. 24 illustrates an embodiment of the invention wherein a stair-step package 142 is attached to a planar printed circuit board 140 with its stair-steps facing away from the printed circuit boards 140. This allows a stair-step connector 141, or any other stair-step interposer device to attach not only to the printed circuit board 140 but also to the stair-steps on the package 142.

Figure 25:
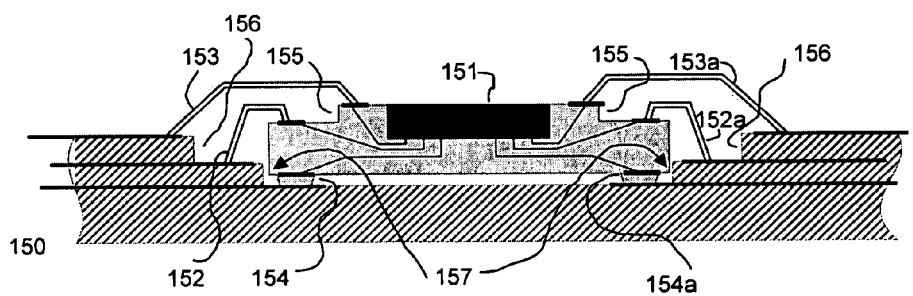
FIG. 25 illustrates a stair-step package mounted onto a stair-step printed circuit board with the stair-steps of both elements facing in the same direction.

FIG. 25 illustrates an embodiment of the invention wherein a stair-step package 151 and interconnected stair-step printed circuit board 150 are arranged such that the stair-steps of the printed circuit board 150 and package 151 do not mate. The package 151 connects to the printed circuit board directly through signal paths 154, 154a. Other signal paths 152, 153, 152a, 153a connect the package 151 and printed circuit board 150.

Figure 26:
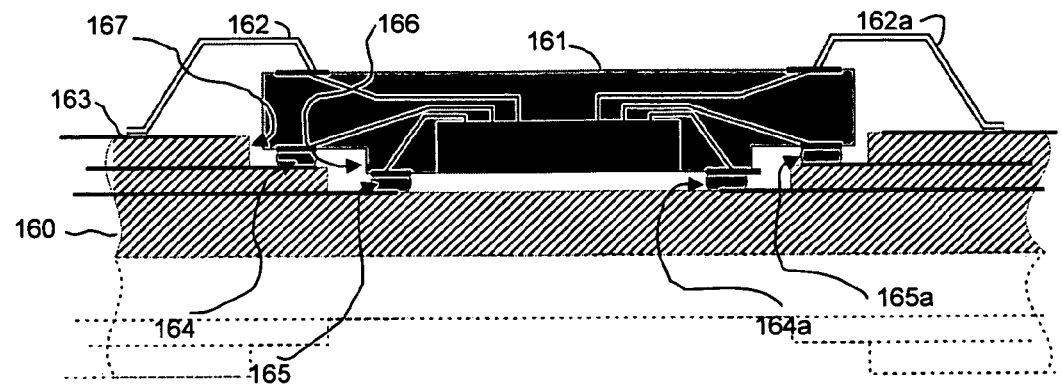
FIG. 26 illustrates a stair-step package mounted onto a stair-step printed circuit board with the stair-steps of both elements facing towards each other.

FIG. 26 illustrates an embodiment of the invention wherein a stair-step package 161, with a single stair step and interconnected stair-step printed circuit board 160, with two stair steps, are arranged such that their respective stair-steps mate. Signal paths 164, 165, 164a 165a are direct connections between the package 161 and the printed circuit board 160. Other signal paths 162, 162a connect the package 161 and printed circuit board 160.

Figure 27:
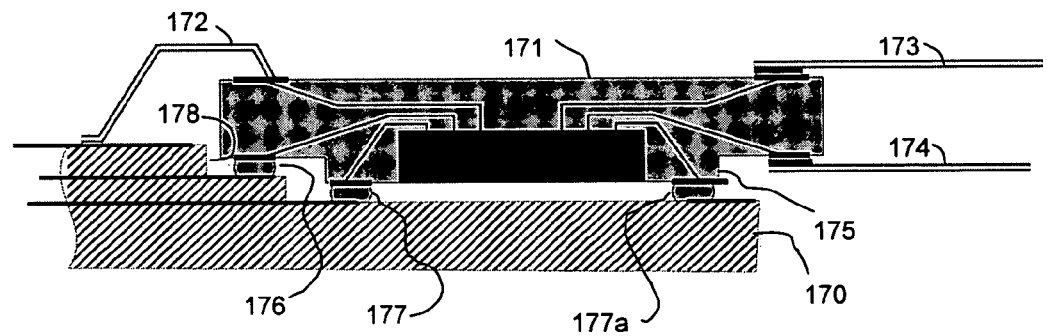
FIG. 27 illustrates a stair-step package mounted onto a printed circuit board wherein each element's stair-steps face each other and the stair-step package and the printed circuit board define the end or edge of the entire assembly.

FIG. 27 illustrates an embodiment of the invention wherein a stair-step package 171 is connected to a printed circuit board 170 which has less than a full surrounding stair-structure, such as at a substrate edge. The portion of the package 171 not mated to the printed circuit board is thus usable as a launching point for signal paths 173, 174.

Figure 28:
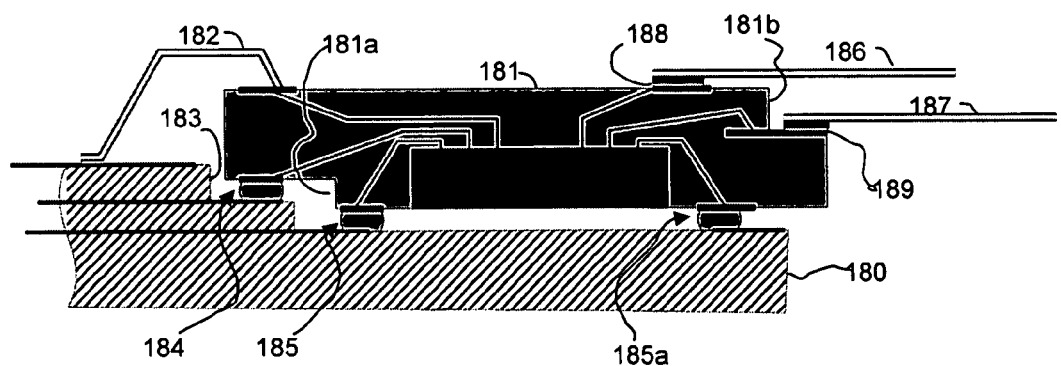
FIG. 28 illustrates a stair-step package mounted onto a stair-step printed circuit board wherein the stair-steps of the package on each side point in opposite directions with one side of the package mounted onto the exposed edge of the stair step printed circuit board.

FIG. 28 illustrates an embodiment of the invention in which a stair-step package 181 has stair-stepping on both top and bottom of the structure 181a, 181b. Other embodiments of stair-stepping are possible wherein any arbitrary surface (top-north, top-east, top-west, top-south, bottom-north, bottom-south, bottom-east, and/or bottom-west) may have selective stair-stepping.

Figure 29:
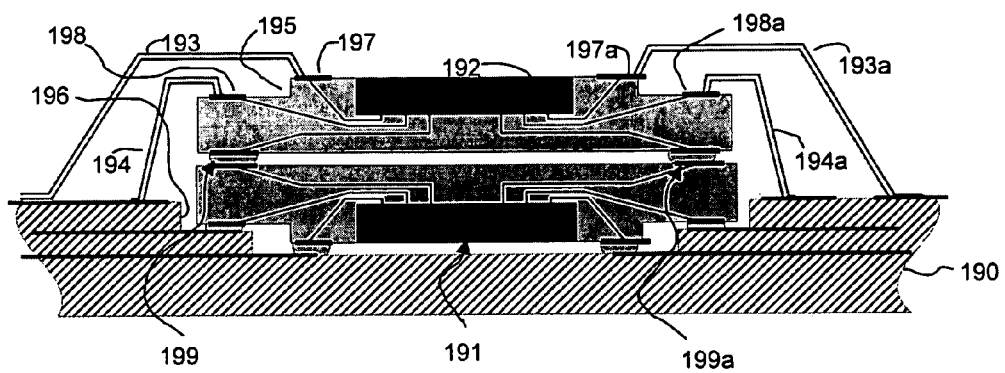
FIG. 29 illustrates two stair-step packages mounted next to each other with their stair-steps facing away from each other and, in combination, mounted on a printed circuit board.

FIG. 29 illustrates an embodiment of the invention wherein two stair-step packages 191, 192 are connected together such that their stair-steps face away from one another and one of the packages 191 is mated to stair-steps within the printed circuit board.

Figure 30:
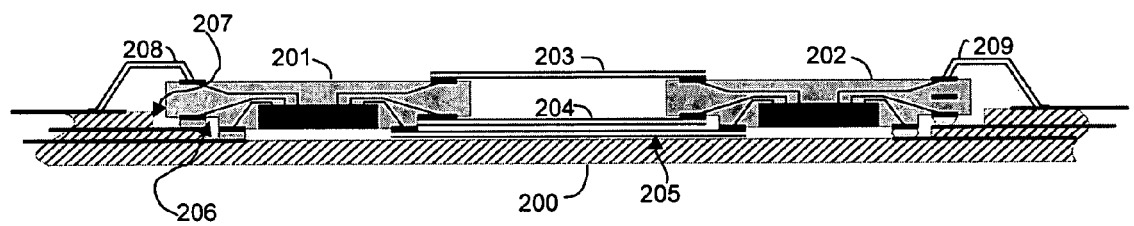
FIG. 30 illustrates a refined diagram of two stair-step packages mounted onto a planar printed circuit board with a planar connection made on the backside of the two packages.
Figure 31:
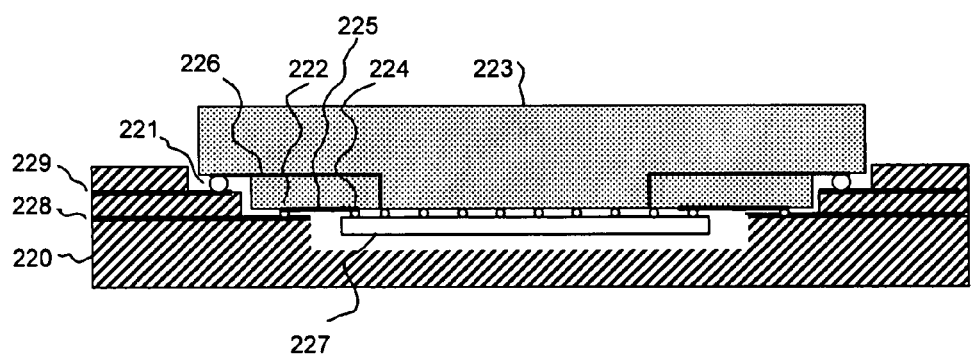
FIG. 31 illustrates a stair-step package mating with a stair-step printed circuit board providing for a straight signal path from the package onto the printed circuit board.

FIG. 30 illustrates an embodiment of the invention wherein two or more stair-step packages 201, 201 are connected to a stair-step printed circuit board 200 and in which not all sides of the packages mate with the printed circuit board. Instead, separate signal paths 203, 204, 205 are placed between the internal open space of the printed circuit board 200 opening (aperture).

Figure 33:
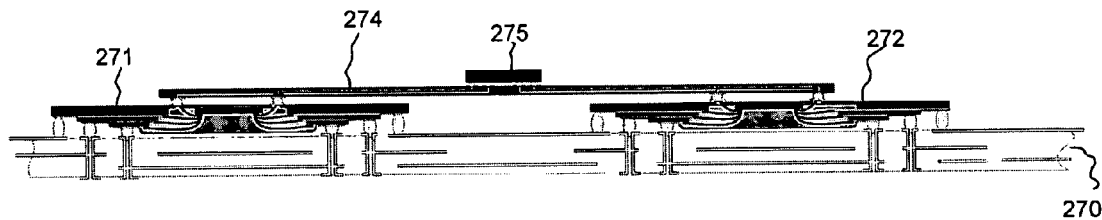
FIG. 33 illustrates two packages mounted in a mating fashion to a single printed circuit board cavity and providing for connection between the packages.

FIG. 33 illustrates an embodiment of the invention wherein a stair-step package 223 is mated to a printed circuit board 220 such that a direct connection path 228, 225 (i.e., the connection path 228, 225 has no turns). Often it is necessary or desirable to minimize right angles or other turns in signal paths to improve signal integrity. In this embodiment, a signal presented on a conductor 228 within the printed circuit board can travel through a small connection point 222 (which may be but is not limited to solder, conductive adhesive, gold dot, etc . . . ) to conductor 225 on a layer of the package 223 and, on conductor 225, proceed through another connection point (which similarly may be but is not limited to solder, conductive adhesive, gold dot, etc . . . ) to device 227 which is mounted on (or) in the package 223. In this way, the signal path remains in a single plane of travel and can provide the best opportunity for matching impedances between different signal paths. In one embodiment, as an example, device 227 could be a semiconductor device attached to the package 223 through the use of C4 pads and its associated bump 224.

Figure 32:
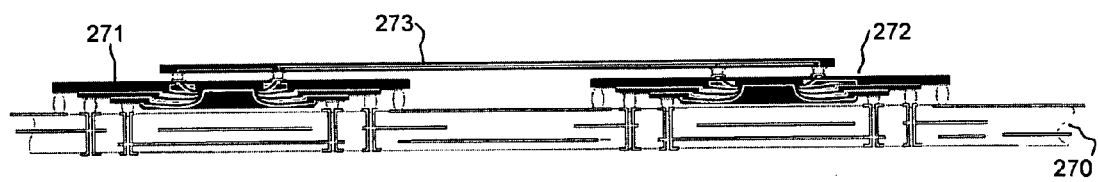
FIG. 32 illustrates a refined diagram of two packages mounted onto a planar printed circuit board with a planar connection, containing a planar package, placed on the backside of the two packages.

FIGS. 32 and 33 illustrate embodiments of the invention in which stair-step packages are mated to a planar printed circuit board. On the planar side of the stair-step package, a substantially rigid substrate is added which allows for connection between the two packages. A variant allows the addition of smaller packages (or integrated circuits specifically) to be placed, and connected on the inflexible substrate.

Although the invention has been described with reference to specific exemplary embodiments thereof, it will be evident that various modifications and changes may be made thereto without departing from the broader spirit and scope of the invention. Accordingly, the specification and drawings are, accordingly, to be regarded in an illustrative rather than a restrictive sense.

What is claimed is:

1. An electrical interconnect assembly comprising:
    a printed circuit board with first and second surfaces facing in opposite directions, first and second terminals disposed on the first surface, a third terminal on the second surface, and a first aperture extending through the printed circuit board from the first surface to the second surface;
    a first integrated circuit package partially disposed within the aperture, the first integrated circuit package comprising i) an IC die with a plurality of conductive die terminals disposed thereupon, at least some of which are coupled to corresponding IC package terminals by respective bond wires; ii) an encapsulant that encapsulates at least some of the bond wires, iii) a first exterior package surface facing in a same direction as the first surface of the printed circuit board and having a fourth terminal disposed thereupon, ii) second and third exterior package surfaces which face in a same direction as the second surface of the printed circuit board and comprise first and second steps of a first stair step structure with corresponding fifth and sixth terminals disposed thereupon, a portion of the first step extending beyond the aperture and facing the first surface of the printed circuit board, wherein the fifth terminal is aligned with, and in electrical continuity with, the first terminal;
    a first conductive member having a first end coupled to the fourth terminal and a second end terminating at a contact on a surface of the printed circuit board; and,
    a second conductive member having a first end coupled with the sixth terminal and a second end coupled with a terminal on the printed circuit board.

2. The electrical interconnect assembly of claim 1, wherein the first end of the first conductive member terminates at the second terminal on the first surface of the printed circuit board.

3. The electrical interconnect assembly of claim 1, wherein the first conductive member is a bond wire.

4. The electrical interconnect assembly of claim 1, wherein the second conductive member is a bond wire.

5. The electrical interconnect assembly of claim 1, wherein the end of the second conductive member terminates on terminal 3.

6. The electrical interconnect assembly of claim 1, wherein the first terminal is in electrical continuity with a signal trace integral to the printed circuit board.

7. The electrical interconnect assembly of claim 1, wherein the first terminal is coupled to a first via that extends at least part way through the printed circuit board.

8. The electrical interconnect assembly of claim 7, wherein the first via is coupled with a signal trace disposed within an interior layer of the printed circuit board.

9. The electrical interconnect assembly of claim 7 wherein the first via is coupled with a signal trace disposed on the second surface of the printed circuit board.

10. The electrical interconnect assembly of claim 1 wherein the integrated circuit package further comprises a fourth exterior package surface, facing the same direction as the second and third exterior package surfaces, and forming part of the first stair step structure.

11. The electrical interconnect system of claim 1 further comprising a second integrated circuit package electrically coupled to the first integrated circuit package.

12. The electrical interconnect system of claim 11 wherein the second integrated circuit package is aligned, at least in part, with the first aperture.

13. The electrical interconnect system of claim 12 further comprising third and fourth integrated circuit packages facing each other, and disposed, at least in part, within the first aperture.

14. The electrical interconnect system of claim 12 wherein the second integrated circuit package has a second stair step structure facing the first stair step structure.

15. The electrical interconnect system of claim 14 further comprising a connective mechanism disposed between, and electrically coupling, the first and second integrated circuit packages.

16. The electrical interconnect system of claim 15 wherein the connective mechanism electrically couples electrical terminals distributed among at least two different stair step surfaces of the first integrated circuit package with electrical terminals distributed among at least two different stair step surfaces of the second integrated circuit package.

17. The electrical interconnect system of claim 11 wherein the second integrated circuit package is adjacent to the first integrated circuit package.

18. The electrical interconnect system of claim 17 further comprising an interposer electrically coupling the first and second integrated circuit packages.

19. The electrical interconnect system of claim 17 wherein the printed circuit board further comprises a signal trace in electrical continuity with first and second integrated circuit packages.

20. The electrical interconnect system of claim 19 wherein the signal trace is on a surface of the printed circuit board.

21. The electrical interconnect system of claim 19 wherein the signal trace is disposed between adjacent insulating layers of the printed circuit board.

22. The electrical interconnect system of claim 11 wherein the second integrated circuit package is aligned, at least in part, with a second aperture.

23. The electrical interconnect system of claim 22 wherein the second integrated circuit package comprises first and second exterior surfaces arranged in stair step arrangement forming first and second stair steps, and a third exterior surface facing a direction different than the first and second stair steps.

24. The electrical interconnect system of claim 23 wherein the third exterior surface of the second integrated circuit package overhangs the printed circuit board, and wherein an electrical terminal disposed on the third exterior surface of overhanging portion of the second integrated circuit package is aligned with, and in electrical continuity with, an electrical terminal disposed on a surface of the printed circuit board.

25. The electrical interconnect system of claim 24 wherein the third exterior surface of the second integrated circuit package faces the second surface of the printed circuit board.

26. The electrical interconnect system of claim 22 further comprising a third integrated circuit package aligned, at least on part, with the first aperture, and a fourth integrated circuit package aligned, at least in part, with the second aperture.

27. The electrical interconnect system of claim 11 wherein the second integrated package comprises a second stair step structure, the second integrated circuit packages being oriented in a mirror image of the first integrated circuit package.

28. The electrical interconnect system of claim 11 wherein the second integrated package comprises a second stair step structure mechanically interlocked with the stair step structure of the first integrated circuit package.

* * * * *